United States Patent
Schaaf et al.

[11] Patent Number: 6,111,933
[45] Date of Patent: Aug. 29, 2000

[54] X-RAY DEVICE INCLUDING A PIEZOELECTRIC TRANSFORMER

[75] Inventors: Uwe Schaaf, Alsbach; Heinz Van Der Broeck, Zülpich; Martin Wimmer, Bad Oldesloe; Arne Lunding, Norderstedt; Reinhard v. Hacht, Halstenbek; Diethard Peter, Hamburg, all of Germany

[73] Assignee: U.S. Philips Corporation, New York, N.Y.

[21] Appl. No.: 09/009,998

[22] Filed: Jan. 21, 1998

[30] Foreign Application Priority Data

Jan. 29, 1997 [DE] Germany .................. 197 031 36

[51] Int. Cl.[7] .................................................. H01J 35/30
[52] U.S. Cl. ..................... 378/137; 378/113; 378/138; 310/359
[58] Field of Search ...................... 378/113, 137, 378/138; 310/359

[56] References Cited

U.S. PATENT DOCUMENTS

| | | | |
|---|---|---|---|
| 3,217,164 | 11/1965 | Williams et al. | 250/102 |
| 3,598,909 | 8/1971 | Sasaki et al. | 348/730 |
| 4,099,056 | 7/1978 | Franke | 378/106 |
| 4,104,526 | 8/1978 | Albert | 378/106 |
| 4,366,395 | 12/1982 | Gillard et al. | 327/597 |
| 4,400,823 | 8/1983 | Haendle | 378/113 |
| 4,481,654 | 11/1984 | Daniels et al. | 378/110 |
| 5,020,086 | 5/1991 | Peugeot | 378/113 |
| 5,736,807 | 4/1998 | Hakamata et al. | 310/359 |
| 5,812,632 | 9/1998 | Schardt et al. | 378/137 |
| 5,822,395 | 10/1998 | Schardt et al. | 378/137 |
| 5,861,704 | 1/1999 | Kitami et al. | 310/369 |
| 5,898,755 | 4/1999 | Meusel et al. | 378/137 |
| 6,006,595 | 12/1999 | Kitamura | 73/105 |

FOREIGN PATENT DOCUMENTS

| | | |
|---|---|---|
| 0480796B1 | 4/1992 | European Pat. Off. . |
| 0727831 | 8/1996 | European Pat. Off. ...... H01L 41/107 |
| 2007246 | 9/1970 | Germany . |

*Primary Examiner*—David P. Porta
*Assistant Examiner*—Allen C. Ho
*Attorney, Agent, or Firm*—Dwight R. Renfrew, Jr.

[57] ABSTRACT

In an X-ray device which includes an X-ray tube (12) provided with means (15, 22, 23) for influencing the electron flow through the X-ray tube (12), a control voltage for the means for influencing the electron flow is customarily generated by means of a complex circuit which, because of its size, is not suitable to be accommodated within the protective tube housing. This has the drawback that the control voltage for the X-ray tube, usually of high voltage potential, must be supplied additionally to the high-voltage supply. Therefore, it is desirable to realize a simple generation means the control voltage which is suitable for accommodation in the protective tube housing. To this end, the invention proposes a piezoelectric transformer (21, 24, 25) for generating the control voltage for the X-ray tube. The invention also relates to a piezoelectric transformer which is particularly suitable for generating such a control voltage.

15 Claims, 3 Drawing Sheets

X-RAY DEVICE INCLUDING A PIEZOELECTRIC TRANSFORMER

BACKGROUND OF THE INVENTION

1. Field of the Invention
2. Description of Related Art

The invention relates to an X-ray device which includes an X-ray tube provided with means for influencing the electron flow through the X-ray tube. The invention also relates to a piezoelectric transformer which includes at least two piezoelectric elements.

The tube current in X-ray tubes can be directly switched off, and hence also the X-rays, by means of a grid which can be connected to a negative grid voltage relative to the cathode potential. Consequently, the X-ray tube can operate with a constant high voltage and no undesirable soft X-rays, are produced which would affect the patient and the attending staff. The grid is driven at the high voltage potential of the cathode which may amount to, for example –75 kV with respect to ground. The voltages required for the reverse and forward modes of the X-ray tube are generated by means of complex electronic grid control circuitry. An X-ray tube of this kind is known from DE-OS 20 07 246.

Using an electrostatic deflection device, the electrons emitted by the cathode in an X-ray tube can be deflected so as to enable variation of the point of incidence (focus) of the electrons on the anode. An X-ray tube of this kind, in which the control voltages for the electrostatic deflection device are generated by means of complex electronic circuitry, is known from EP-B1-480 796.

Piezoelectric transformers are known electric components which utilize the direct piezoelectric effect and at the same time its reversal in a component. Electric energy is first converted into mechanical energy in a first piezoelectric element and, after the internal transfer of mechanical energy from the first to a second piezoelectric element, it is converted into electric energy again in the second piezoelectric element. The voltage transformer used is a piezoelectric type which, for example, steps up a low voltage applied to its input to a high voltage at its output. A piezoelectric transformer may have a very high transformation ratio in such a case.

Often a problem is encountered that a signal must be transformed and that at the same time the signal (to be transformed) has a potential other than that of the (transformed) output signal. Therefore, often steps are required for potential separation between the input signal and the output signal.

SUMMARY OF THE INVENTION

It is an object of the invention to provide an X-ray tube in which the control voltages are simply generated.

It is also an object of the invention to provide a piezoelectric transformer where the input signal and the output signal of the transformer are of distinctly different potential.

On the basis of an X-ray device of the kind set forth the first mentioned object is achieved in that the X-ray device includes a piezoelectric transformer for generating a control voltage for means for influencing electron flow through an X-ray tube of the X-ray device. The piezoelectric transformer is a simple, compact and inexpensive facility for generating an output voltage serving as a control voltage applied to the means for influencing the electron flow, and can replace a significant part of the electronic control circuitry, notably a conventional transformer. Moreover, a piezoelectric transformer has the advantage that its internal losses are only small.

The X-ray device in a further embodiment include a grid for controlling the tube current or a deflection device for deflecting the electrons emitted by the cathode of the X-ray tube.

In a particularly compact embodiment the piezoelectric transformer is accommodated in the protective tube housing.

The piezoelectric transformer in a preferred embodiment includes at least two piezoelectric elements, an isolator element for electrical isolation of the piezoelectric elements being inserted between the piezoelectric elements, the piezoelectric elements and the isolator element being arranged in such a manner that the mechanical forces produced in one piezoelectric element are transferred to the other piezoelements. The voltage to be transformed and present at the first piezoelectric element, the so-called actuator, is first converted into a mechanical force thereby. Via the isolator element, being as mechanically rigid as possible, the mechanical force is transferred to the second piezoelectric element, the so-called generator, in which the mechanical force is converted into an electric voltage again. Because the input voltage and the output voltage of the piezoelectric transformer are of different potentials in the described applications, the construction of the isolator element inserted between the actuator and the generator is suitably high voltage resistant, for example suitably thick, so as to enable isolation of the potential difference existing between the actuator and the generator.

In order to ensure that the force is transferred from the actuator to the generator as efficiently and as loss-free as possible, the piezoelectric transformer in an embodiment according to the invention is provided with a clamping device for keeping the piezoelectric transformer together. Actuator and generator and a possibly present isolator are retained by this as rigid as possible clamping device in such a manner that the overall longitudinal dimension of the piezoelectric transformer cannot vary, notably that the piezoelectric transformer cannot expand since expansion causes a loss of efficiency.

The piezoelectric transformer in a preferred embodiment of the invention is conceived for quasi-static operation. Whereas known piezoelectric transformers are customarily operate in the resonance mode, so that they can transfer only alternating voltages, the above piezoelectric transformer operates below any self resonance. The piezoelectric transformer, therefore, is suitable for the transfer of very low frequency signals (for example, pulse-shaped direct voltage signals having frequencies of from some hertz to less then one hertz) and for direct voltage signals. The particular advantage of quasi-static operation of a piezoelectric transformer resides in the fact that it has a very short rise and fall time, so that it is suitable for the fast switching on and off of voltages.

Furthermore, in accordance with the invention the piezoelectric transformer is connected to ground potential at its input side and to the high voltage potential of the cathode of the X-ray tube at its output side. The piezoelectric transformer described above is particularly suitable for this purpose because it is provided with a facility for potential separation. However, conventional piezoelectric transformers can also be used, provided that other steps are taken for potential separation.

Because only comparatively small amounts of energy are required to control the grid in an X-ray tube or for driving a deflection device, the control voltage for the grid or the deflection device can be generated by means of a piezoelectric transformer. The control signal to be amplified is then applied to the piezoelectric transformer by a control device.

On the basis of a piezoelectric transformer of the kind set forth, the object concerning the piezoelectric transformer is achieved in accordance with the invention in that between the piezoelectric elements there is inserted an isolator element for electric isolation of the piezoelectric elements, and that the piezoelectric elements and the isolator elements are arranged in such a manner that the mechanical forces produced in one piezoelectric element are transferred to the other piezoelectric elements.

In a further embodiment of this piezoelectric transformer, the spacing of the electrodes of the piezoelectric element at the input side differs from that of the electrodes of the piezoelectric element at the output side. When the electrode spacing of the piezoelectric element (generator) at the output side is substantially larger than that of the piezoelectric element (actuator) at the input side, the output voltage will be higher than the input voltage; the input voltage is thus stepped up. The transmission ratio of such a transformer is significantly influenced by the ratio of the electrode spacing of the generator to the electrode spacing of the actuator, notably in the case of application of a direct voltage or a very low frequency voltage. The higher this spacing ratio, the higher the transformation ratio will be.

In a preferred embodiment of the invention, one or more piezoelectric elements consist of a plurality of piezoelectric layers. An actuator consisting of a plurality of layers, a so-called multilayer actuator, is preferably used at the input side. The transformation ratio of the transformer is also influenced by the number of layers. Generally speaking, the more layers are present in a piezoelectric element, the higher the transformation ratio will be.

Preferably, according to the invention the piezoelectric elements and the isolator element have a cylindrical shape and are stacked on one another. This embodiment is particularly attractive with a view to compactness and cost.

BRIEF DESCRIPTION OF THE DRAWINGS

The invention will be described in detail hereinafter with reference to the drawings. Therein.

DETAILED DESCRIPTION OF THE PREFERRED EMBODIMENTS

Figure 1:
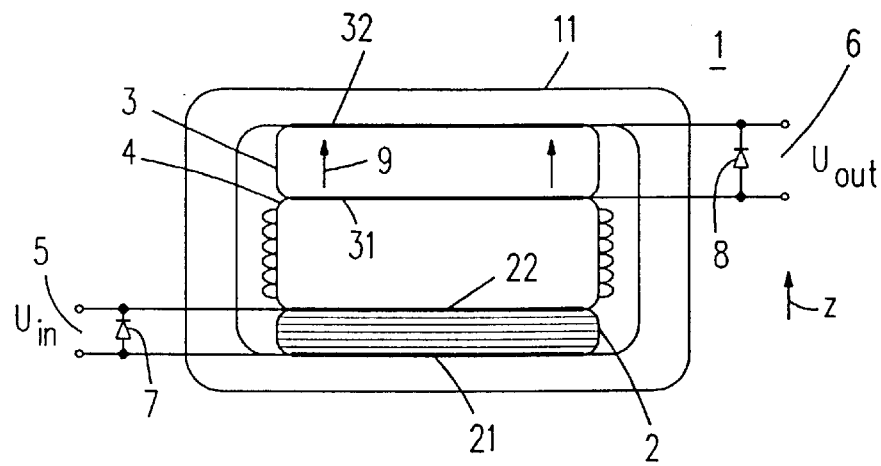
FIG. 1 is a cross-sectional view of a piezoelectric transformer according to the invention.

FIG. 1 shows a piezoelectric transformer 1 according to the invention. The Figure shows a stack consisting of: a first piezoelectric element 2 (the actuator), an isolator element 4, and a second piezoelectric element 3 (the generator). The exterior of the isolator element 4 is provided with ridges which serve to prolong the creepage path for the high voltage. The actuator 2, being a so-called multilayer actuator consisting of a plurality of piezoelectric layers, has a respective electrode 21, 22 at its lower side and its upper side, respectively. The input voltage $U_{in}$ to be transformed is applied to the electrodes 21, 22 at the input 5. At its lower and upper side the generator 3 is also provided with a respective electrode 31, 32 wherefrom the transformed output voltage $U_{out}$ can be derived via the output 6. The polarity of the piezoelectric layer of the generator 3 is denoted by an arrow 9. The actuator 2, the generator 3 and the isolator element 4 are shaped as cylindrical discs having a circular cross-section and are enclosed by a clamping device 11. The clamping device 11 rigidly clamps the stack formed by the actuator 2, the isolator element 4 and the generator 3 in such a manner that the overall stack cannot expand in the z direction, i.e. that the overall dimension of the stack in the z direction cannot become larger than allowed by the clamping device 11.

When a voltage is applied to the input 5 of the piezoelectric transformer 1, the actuator 2 expands in the z direction. In order to ensure that this mechanical force is transferred to the generator 3 without loss, and hence causes compression of the generator 3 in the z direction, the isolator element 4 must be so rigid that it is not compressed by the forces applied. Ideally, the dimensions of the isolator element 4 and the clamping device 11 in the z direction do not vary. The compression of the generator 3 causes a voltage $U_{out}$ at the output 6 which, in the case of quasi-static operation of the piezoelectric transformer 1, is a factor higher than the input voltage $U_{in}$ for the configuration shown. The transformation ratio is then dependent on the ratio of the spacing of the electrodes 31 and 32 to the spacing of the electrodes 21 and 22.

A respective safety diode 7, 8 is connected between the connection terminals at the input 5 as well as at the output 6. After a voltage transient from a high to a lower voltage free charges could flow as so-called leakage currents at the input 5 as well as at the output 6, which leakage currents could cause a voltage of opposite polarity for a given period of time. Such a voltage could damage the piezoelectric elements 2 and 3, notably the multilayer actuator 2, which can in the long term withstand only a voltage of a few volts of the incorrect polarity without being damaged.

The operation of the piezoelectric transformer can also be reversed by reversing the polarization of the piezoelectric layers of the actuator 2 and the generator 3. Upon application of a voltage 3 to the input 5, the actuator 2 would then be compressed, causing an expansion of the generator 3 wherefrom the transformed output voltage could be derived again.

In a practical embodiment of the piezoelectric transformer shown in FIG. 1, the thickness of the actuator, consisting of 90 layers, amounts to 4 mm, that of the isolator element to 10 mm and that of the generator to 5 mm. The diameter of the circular discs amounts to 10 cm. Using such a transformer, a voltage transformation ratio of approximately 50 is achieved. Because of its high breakdown strength and its high mechanical rigidity, aluminium oxide ($Al_2O_3$) is a particularly attractive material for the isolator element. This material is preferably also used for the clamping device in order to reduce the thermal drift (variation of the mechanical clamping due to different thermal expansion). However, other mineral materials (beryllium oxide ceramic, hard glass, glass ceramic, quartz) are also suitable isolating materials.

Figure 2:
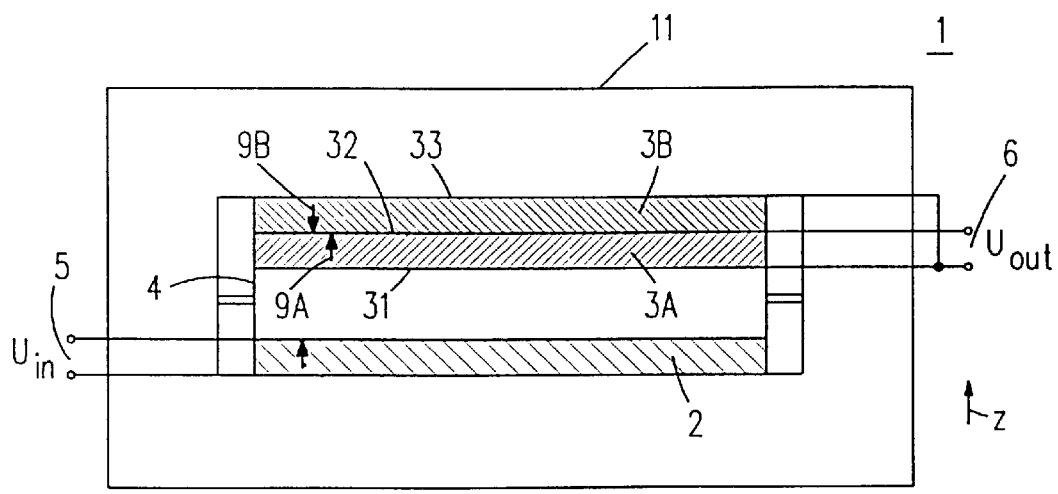
FIG. 2 is a simplified cross-sectional view of a further embodiment of a piezoelectric transformer.

FIG. 2 shows a further embodiment of the piezoelectric transformer 1 according to the invention. As opposed to the embodiment shown in FIG. 1, two piezoelectric elements (generators) 3A,B are stacked on the isolator element 4 at the generator side. The polarity of the piezoelectric layers of these two generator elements 3A, 3B is oppositely directed as denoted by the arrows 9A and 9B. Moreover, the lower electrode 31 and the upper electrode 33 are electrically interconnected at the output 6. The second output terminal is connected to the central electrode 32. Because of this construction it is achieved that the amount of charge generated at the generator side is larger than that generated when only one generator element is used. Whereas the voltage varies only slightly, however, the self-capacitance of the generator 3 increases. The basic effect of the stacking of two (or more) generator elements 3A, 3B, where the polarity of neighboring piezoelectric layers opposes one another, consists in that the so-called voltage-time constant is increased. The voltage-time constant is a measure as to how fast a voltage present at the output decreases without variation of the input voltage. Notably in the case of quasi-static operation it must be ensured that when a direct voltage is present at the input, the transformed direct voltage at the output remains constant for as long as possible and decreases only slowly, i.e. that the voltage time constant is as high as possible.

Figure 3:
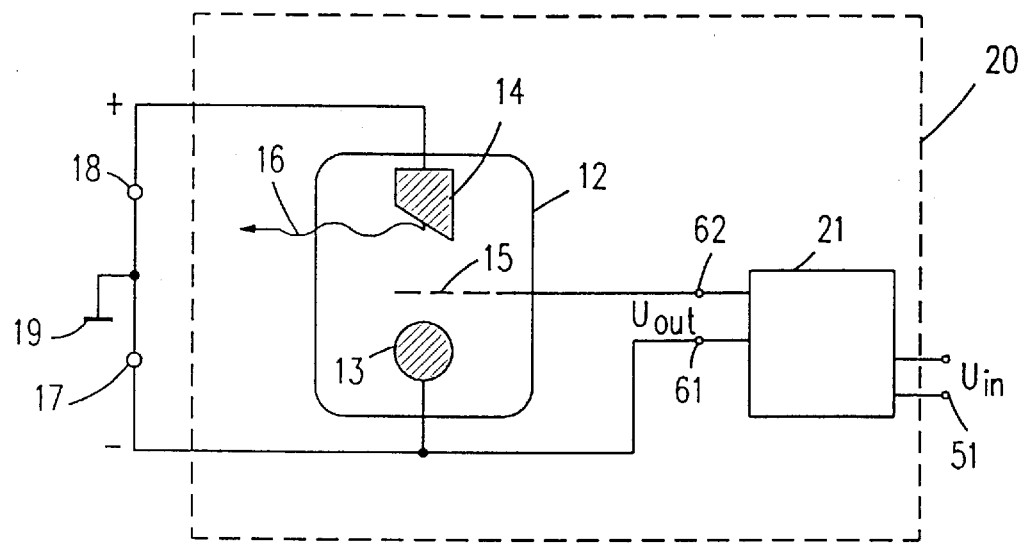
FIG. 3 shows a circuit diagram of an X-ray tube with grid control according to the invention.

FIG. 3 shows a circuit diagram of an X-ray device according to the invention which includes an X-ray tube 12. The X-ray tube 12 includes a cathode 13, an anode 14 on which X-rays 16 are generated by incidence of electrons, and a grid 15 for controlling the tube current. A first high-voltage source 17 supplies the cathode 13 with a negative high-voltage potential, for example −75 kV relative to ground; a second high-voltage source 18 supplies the anode 14 with a positive high voltage of, for example +75 kV. The grid 15 is controlled by means of a piezoelectric transformer 21 which may be constructed, for example as shown in the FIGS. 1 or 2. Because of the small dimensions, the piezoelectric transformer 21 may be accommodated in the protective tube housing 20, together with the X-ray tube 12.

The current flowing through the X-ray tube 12 can be switched on and off by means of a voltage applied to the grid 15. The reverse mode requires a negative voltage of approximately −3 kV relative to the cathode potential and the forward mode requires a negative, small voltage of from 0 to 400 volts relative to the cathode potential. The grid control voltage $U_{out}$ thus has cathode potential, i.e. the reference electrode 61 is connected to the high-voltage terminal of the cathode 13 and the second output electrode 62 is connected to the grid 15. The input voltage $U_{in}$ of the piezoelectric transformer 1, however, usually has a low-voltage potential, for example ground potential, i.e. the electrode 51 is connected to ground potential 19. The piezoelectric transformer 1 thus provides amplification of the control input signal $U_{in}$ and at the same time provides potential separation between the input signal and the output control signal $U_{out}$.

An X-ray device of this kind is suitable for fluoroscopy techniques which require pulsed operation with a high recurrent frequency (for example, 25 Hz), for example for cardiac catheter examinations. However, this X-ray device is also suitable for fluoroscopy techniques with a low recurrent frequency, for example down to one half hertz. The grid control voltage for the reverse mode as well as for the forward mode can then be maintained constant for several hundred milliseconds. On the other hand, a recurrent frequency of at the most 125 Hz is also possible. The particular advantage of this embodiment resides in the fact that it is not necessary to switch the high-voltage supply for the cathode and the anode on and off in order to switch the tube current on and off because the switching on and off of the tube current is controlled by the grid control voltage. The high-voltage supply for the tube can thus remain switched on continuously.

Figure 4:
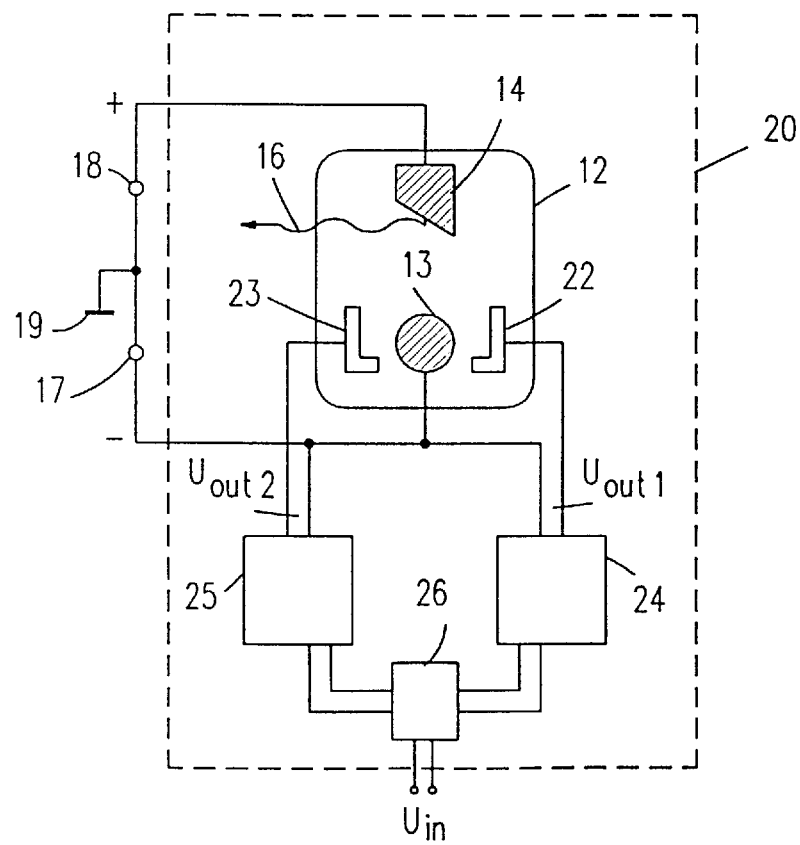
FIG. 4 shows a circuit diagram of a further X-ray device with a deflection device for the electrons according to the invention.

FIG. 4 shows a circuit diagram of a further X-ray device according to the invention. The X-ray tube 12 thereof includes an electromagnetic deflection device for deflecting the electron beam and for adjusting the focal spot. The deflection device includes two deflection plates 22, 23 which are arranged to the side of the cathode. The deflection plates 22, 23 carry a positive or negative potential of a few kV relative to the high-voltage potential of the cathode 13. The control voltages for the deflection plates are the output voltages $U_{out1}$, $U_{out2}$ of a respective piezoelectric electric transformer 24, 25. A control unit 26 switches the control signal $U_{in}$ with the appropriate polarity to the inputs of the piezoelectric transformers 24, 25.

The electrons emitted by the cathode 13 in such a device can be influenced and deflected. Notably the point of incidence of the electrons on the anode 14 can be shifted a few millimetres, as is done particularly for computer tomography. To this end, a positive and a negative voltage, relative to cathode potential, are alternately applied to the deflection plate 22, whereas a voltage of the same value but opposite polarity is applied to the deflection plate 23. Subject to the condition that the piezoelectric transformers 24, 25 are identical, the signal present at their inputs must also have the opposite polarity for this purpose; this is controlled by the control unit 26. However, use can alternatively be made of piezoelectric transformers 24, 25 having differently polarized piezoelectric layers, so that an identical control signal $U_{in}$ can be applied to their inputs.

The piezoelectric transformers 24, 25, in the device shown in FIG. 4 are constructed, for example as shown in FIG. 1 or FIG. 2 and are accommodated, together with the control unit 26, in the protective tube housing 20.

The embodiment shown in FIG. 4 is also suitable for implementing further applications. For example, two identical focal spots with a spacing of from several millimetres to a few centimetres can be generated by applying a positive voltage, relative to cathode potential, alternately to one of the two deflection plates 22, 23, the respective other deflection plate carrying each time a negative voltage. The embodiment shown also enables refocusing (biasing) of the focal spot or variation of the size of the focal spot, in dependence on the application and the exposure parameters, by adjustment of the voltage potentials applied to the deflection plates 22, 23.

On the basis of the embodiment shown in FIG. 3 an X-ray device can be conceived which includes two separate cathodes with a respective grid and a respective piezoelectric transformer for generating the grid control voltage. Two spatially separated, non-overlapping focal spots can thus be generated by temporally successively supplying one of the grids with a reverse voltage and the other grid with a forward voltage.

Instead of the quasi-statically operating piezoelectric transformers with integrated potential separation as shown in the FIGS. 1 and 2, conventional piezoelectric transformers, comprising two piezoelectric layers but not an isolator layer for potential separation, can be used in the X-ray device shown in FIG. 3 as well as in that shown in FIG. 4. In this respect piezoelectric transformers are feasible which operate in the quasi-static mode, in resonance or deliberately beyond mechanical self resonance. However, in that case other steps must be taken for potential separation, said steps being implemented outside the piezoelectric transformer because the grid in a grid-controlled X-ray tube as well as the deflection device in an X-ray tube with a variable focal spot can be driven only at cathode potential and the control signal usually has ground potential.

Figure 5:
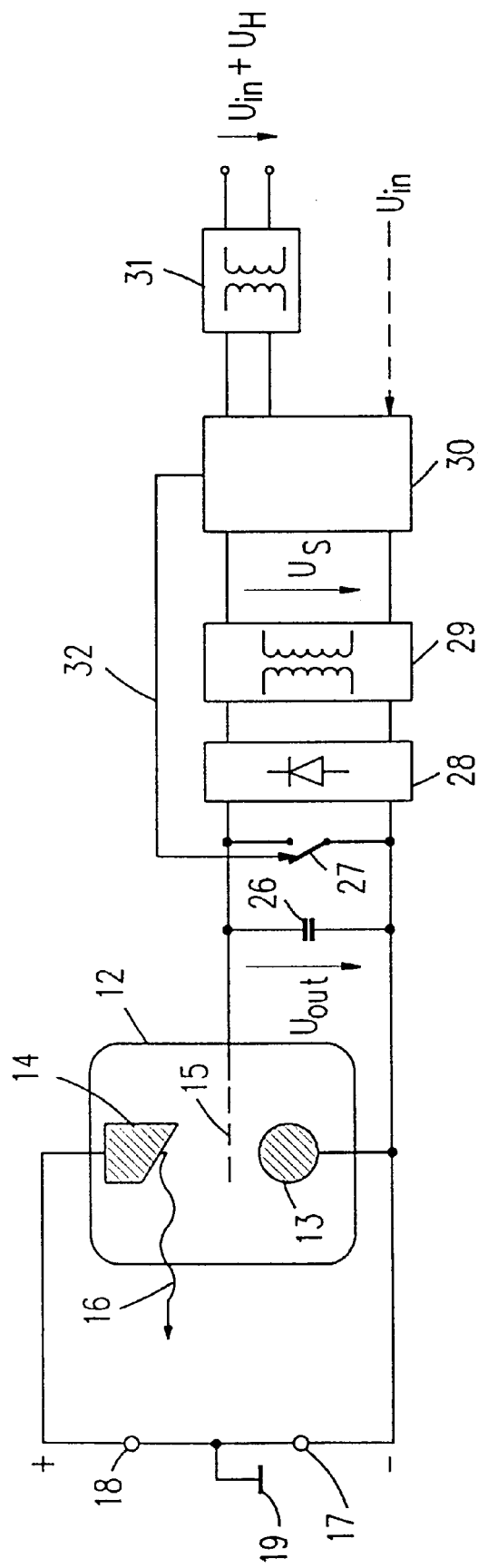
FIG. 5 shows a circuit diagram of a further X-ray device with grid control according to the invention.

FIG. 5 shows a further embodiment of an X-ray device according to the invention which is provided with a grid 15. The input control signal $U_{in}$ is then modulated on the supply voltage $U_H$ for the filament (for heating the cathode). A power transformer 31 (filament transformer) having a high isolating voltage provides voltage transformation to a high-voltage potential, for example to the cathode potential of −75 kV. Inter alia the filament current for the cathode is conducted further, controlled or not, in a control and power unit 30; this operation takes place in a conventional manner which will not be described herein.

In the control and power unit 30 the input control signal $U_{in}$ is separated from the supply voltage $U_H$, for example by demodulation, and an appropriate control signal $U_s$ is generated and applied to a piezoelectric transformer 29 which steps up the control signal $U_s$. The stepped-up output signal of the piezoelectric transformer 29 is rectified in a rectifier circuit 28 and the rectified signal $U_{out}$ is then used as a grid control voltage for switching the X-ray tube on and off in the manner described above (FIG. 3).

A capacitor 26 serves to smooth the grid control voltage $U_{out}$. Depending on the requirements imposed as regards the ripple of the signal to be smoothed, the capacitance of the capacitor 26 may be comparatively high; consequently, the rising and falling edges of the grid control voltage are flatter as the capacitance is higher. In the case of a high capacitance, however, fast switching on and off of the tube current would not be possible. Therefore, there is also provided a switch 27 which is controlled by the control and power unit 30 as denoted by the path 32. The switch 27 is opened when the grid control voltage $U_{out}$ is to be switched over from a low voltage to a high voltage (for example, from −200 V to −3 kV), i.e. when the tube current is to be switched off. If the grid control voltage $U_{out}$ is to be switched from a high voltage to a low voltage, i.e. when the tube current is to be switched on, the switch 27 is closed so that the capacitance can be quickly discharged.

The input signal $U_{in}$ need not necessarily be modulated on the supply voltage $U_H$ but can also be separately applied to the control and power unit 30 via a fiber-optical interface as denoted by dashed lines in FIG. 5. The input control signal $U_{in}$ can then be transferred, for example optically via a fiber-optical link.

In the embodiment shown in FIG. 5, the piezoelectric transformer 29 is preferably a customary piezoelectric transformer operating in resonance. However, use can also be made of a quasi-statically operating piezoelectric transformer without integrated potential separation but provided with a clamping device of the kind shown in FIG. 1. The elements 26, 27 and 28 can be dispensed with when such a piezoelectric transformer is used.

The potential separation is then provided by the power transformer 31 which is preferably arranged in the protective tube housing, like said elements 26 to 30, so that damped high-voltage cables can be used. However, the power transformer 31 may also be arranged outside the protective tube housing; however, in that case damped high-voltage cables cannot be used. Similarly, the elements 26 to 30 may also be arranged outside the protective tube housing; however, this has the drawback that, instead of a three-pole cable, a less flexible and more expensive four-pole cable is required between the high-voltage generator and the X-ray tube, because it is also necessary to supply the grid control voltage of high-voltage potential.

All references cited herein, as well as the priority document German Patent Application 19703136.6 filed Jan. 29, 1997, are incorporated herein by reference in their entirety and for all purposes to the same extent as if each individual publication or patent or patent application was specifically and individually indicated to be incorporated by reference in its entirety for all purposes.

What is claimed is:

1. An X-ray device which includes an X-ray tube provided with means for influencing the electron flow through the X-ray tube wherein the X-ray device includes a piezoelectric transformer for generating a control voltage for the means, and wherein the piezoelectric transformer is accommodated in a protective housing of the x-ray tube.

2. An X-ray device as claimed in claim 1, characterized in that the means include a grid for controlling the tube current or a deflection device for deflecting the electrons emitted by the cathode.

3. An X-ray device as claimed in claim 2, characterized in that the piezoelectric transformer is provided with a clamping device for keeping the piezoelectric transformer together.

4. An X-ray device as claimed in claim 2, characterized in that the piezoelectric transformer includes at least two piezoelectric elements, that an isolator element for electrical isolation of the piezoelectric elements is inserted between the piezoelectric elements, and that the piezoelectric elements and the isolator element are arranged in such a manner that the mechanical forces produced in one piezoelectric element are transferred to the other piezoelectric elements.

5. The X-ray device as claimed in claim 4, characterized in that the piezoelectric transformer is provided with a clamping device for keeping the piezoelectric transformer together.

6. An X-ray device as claimed in claim 2, characterized in that the piezoelectric transformer is accommodated in the protective tube housing.

7. An X-ray device as claimed in claim 6, characterized in that the piezoelectric transformer includes at least two piezoelectric elements, that an isolator element for electrical isolation of the piezoelectric elements is inserted between the piezoelectric elements, and that the piezoelectric elements and the isolator element are arranged in such a manner that the mechanical forces produced in one piezoelectric element are transferred to the other piezoelectric elements.

8. An X-ray device as claimed in claim 6, characterized in that the piezoelectric transformer is provided with a clamping device for keeping the piezoelectric transformer together.

9. An X-ray device as claimed in claim 1, characterized in that the piezoelectric transformer includes at least two piezoelectric elements, that an isolator element for electrical isolation of the piezoelectric elements is inserted between the piezoelectric elements, and that the piezoelectric elements and the isolator element are arranged in such a manner that the mechanical forces produced in one piezoelectric element are transferred to the other piezoelectric elements.

10. An X-ray device as claimed in claim 1, characterized in that the piezoelectric transformer is provided with a clamping device for keeping the piezoelectric transformer together.

11. An X-ray device which includes an X-ray tube provided with means for influencing the electron flow through the X-ray tube wherein the X-ray device includes a piezoelectric transformer for generating a control voltage for the means, wherein the piezoelectric transformer includes at least two piezoelectric elements, wherein an isolator element for electrical isolation of the piezoelectric elements is inserted between the piezoelectric elements, and wherein the piezoelectric elements and the isolator element are arranged in such a manner that the mechanical forces produced in one piezoelectric element are transferred to the other piezoelectric elements.

12. An X-ray device as claimed in claim 11, characterized in that the piezoelectric transformer is conceived for quasi-static operation.

13. An X-ray device as claimed in claim 11, characterized in that the piezoelectric transformer is provided with a clamping device for keeping the piezoelectric transformer together.

14. An X-ray device which includes an X-ray tube provided with means for influencing the electron flow through the X-ray tube wherein the X-ray device includes a piezoelectric transformer for generating a control voltage for the means, and wherein the piezoelectric transformer is provided with a clamping device for keeping the piezoelectric transformer together.

15. An X-ray device which includes an X-ray tube provided with means for influencing the electron flow through the X-ray tube, characterized in that the X-ray device includes a piezoelectric transformer for generating a control voltage for the means, and wherein the piezoelectric transformer is connected to ground potential at its input side and to the high voltage potential of the cathode at the output side.

* * * * *